United States Patent
Gauthier

(10) Patent No.: US 8,204,458 B2
(45) Date of Patent: Jun. 19, 2012

(54) TRANSMITTING DEVICE AND METHOD OF TUNING THE TRANSMITTING DEVICE

(75) Inventor: Laurent Gauthier, Toulouse (FR)

(73) Assignee: Freescale Semiconductor, Inc., Austin, TX (US)

( * ) Notice: Subject to any disclaimer, the term of this patent is extended or adjusted under 35 U.S.C. 154(b) by 443 days.

(21) Appl. No.: 12/305,159

(22) PCT Filed: Jul. 13, 2006

(86) PCT No.: PCT/IB2006/054096
§ 371 (c)(1),
(2), (4) Date: Dec. 16, 2008

(87) PCT Pub. No.: WO2008/010027
PCT Pub. Date: Jan. 24, 2008

(65) Prior Publication Data
US 2009/0130997 A1    May 21, 2009

(51) Int. Cl.
*H04B 1/04* (2006.01)
(52) U.S. Cl. .......................... 455/123; 455/121; 455/125
(58) Field of Classification Search .................... 455/91, 455/115.1, 120–125, 129
See application file for complete search history.

(56) References Cited

U.S. PATENT DOCUMENTS

| | | | |
|---|---|---|---|
| 3,129,386 A | 4/1964 | Daly | |
| 3,509,500 A | 4/1970 | McNair et al. | |
| 3,643,163 A | 2/1972 | Bruck | |
| 3,906,405 A | 9/1975 | Kommrusch | |
| 6,670,864 B2 * | 12/2003 | Hyvonen et al. | 333/32 |
| 6,735,418 B1 * | 5/2004 | MacNally et al. | 455/78 |
| 6,842,710 B1 * | 1/2005 | Gehring et al. | 702/107 |
| 7,512,386 B2 * | 3/2009 | Kalajo et al. | 455/127.1 |
| 2005/0003771 A1 | 1/2005 | De Ruijter et al. | |
| 2005/0219132 A1 | 10/2005 | Charrat | |

FOREIGN PATENT DOCUMENTS

JP    408213920 A * 8/1996

OTHER PUBLICATIONS

"Automatic Antenna Tuning RF Transmitter IC Applying High Q Antenna" White Paper; Jul. 30, 2004; Integration Associates, Inc.; 6 pp; Mountain View, CA.
MICRF103 QwjkRadio UHF ASK Transmitter Data Sheet; Jun. 2002; pp. 1-7; Micrel, Inc.; San Jose, CA.

* cited by examiner

*Primary Examiner* — Dinh T. Le

(57) ABSTRACT

A transmitting device comprising a transmitter, an antenna and a tuning means comprising a matching network connectable between the transmitter and the antenna, the matching network comprising a plurality of capacitors; characterized in that the tuning means further comprises a means of selectively individually adjusting the capacitors to increase the output power of the transmitting device.

19 Claims, 9 Drawing Sheets

TRANSMITTING DEVICE AND METHOD OF TUNING THE TRANSMITTING DEVICE

FIELD OF THE INVENTION

This invention relates to a transmitting device and method of tuning same.

BACKGROUND OF THE INVENTION

Short range, license-free, wireless applications operating in the Industrial Scientific Medical (ISM) bands (e.g. door openers, tire pressure monitoring systems (TPMS), wireless mice and wireless local area networks (WLANs)) have become popular in recent years. Such applications typically comprise one or more transmitting devices, which transmit a radio signal to one or more receiving devices. On receipt of a signal from the transmitting device(s), the receiving device(s) take an appropriate action.

Transmitting device(s) are typically mobile, handheld devices, which comprise a transmitter (for generating signals), an antenna (for transmitting the signals) and a battery (as an internal energy source for such transmissions). However, the batteries are usually quite small. Thus, power consumption is a critical factor in the design of such transmitting device(s).

The antenna in a transmitting device is a load on the device's transmitter. Maximally efficient power transfer between a transmitter and an antenna is only achieved when the transmitter impedance is the complex conjugate of the antenna impedance. However, the sensitivity of antenna impedance to surrounding conditions is making the task of matching the impedances of antennas and transmitters quite difficult. Attempts to solve this problem have been ongoing for some time.

Integration Associates (Automatic Antenna Tuning RF Transmitter IC Applying High Q Antenna—White Paper Ver. 1.0 (IA ISM-WP1), Integration Associates Inc., 2004) and Micrel (MICRF103 QwikRadio (trademark) ASK Transmitter FINAL, June 2002) have proposed a solution in which a single capacitor adjusts the reactive part of antenna impedance. However, any reduction in impedance mismatch achieved by this method would be limited, as it does not take into account the resistive components of the antenna impedance and transmitter impedance. Moreover, the Integration Associates and Micrel solutions are only applicable to source current transmitters, as the measurements used to match the impedances are phase differences between the base and collector of a transistor in a switched current source configuration.

U.S. Patent Application US2005219132 describes a system in which two capacitors of a PI matching network are tuned. Impedance matching is achieved by measuring the voltage and the phase difference between the input and output of the matching network. However, the system described in US2005219132 requires A/D convertors and a phase comparator and would be difficult to implement at the frequency of 868 MHz typically employed in automotive applications.

U.S. Patent Application US2005003771 describes a circuit for automatically tuning a resonant circuit in a transceiver. The circuit adjusts a single capacitor connected between the two outputs of a differential amplifier, wherein the adjustments are made on the basis of the phase difference between the input and the output of the amplifier. However, in a similar manner to the Integration Associates and Micrel solutions, the circuit in US2005003771 only provides reactive impedance matching. Furthermore, the circuit does not work with Class C amplifiers.

More generally, by using only a single adjustable capacitor, prior art solutions available at frequencies of 434-868 MHz have limited ability to match the impedances of a transmitter and antenna. In particular, whilst the prior art solutions provide reactive impedance cancellation, they do not provide conjugate matching.

SUMMARY OF THE INVENTION

The present invention provides a transmitting device and method of tuning the transmitting device as described in the accompanying claims.

BRIEF DESCRIPTION OF THE DRAWINGS

FIG. 5b is a Smith chart showing the different matching points possible with an adjustment of a first capacitor in a matching network controlled by the embodiment of FIG. 2 in the transmitting device of FIG. 5a;

Figure 2:
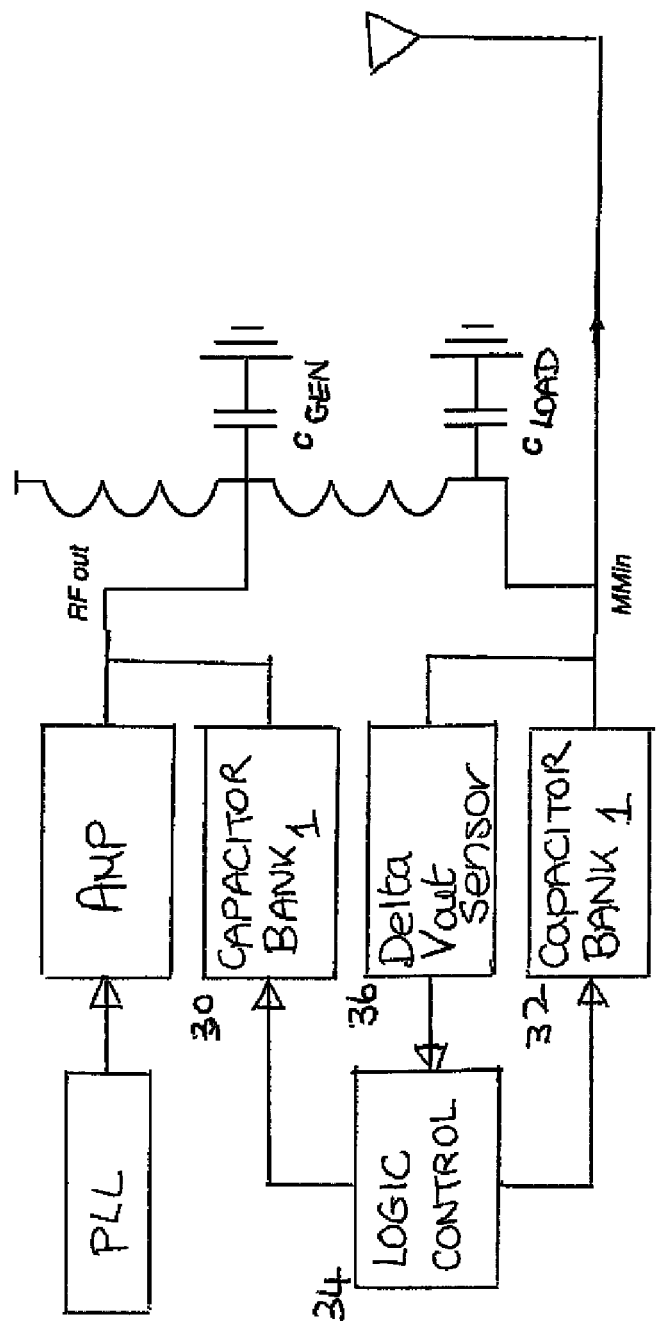
FIG. 2 is a block diagram of a tuning apparatus in accordance with one embodiment of the invention, given by way of example.

Table 1 shows the power loss of a conventional matching network, prior art reactive impedance matching network and matching network controlled by the embodiment of FIG. 2 under free field conditions and when the impedance of an antenna has been altered by the hand-effect.

DETAILED DESCRIPTION OF THE PREFERRED EMBODIMENTS

Figure 1:
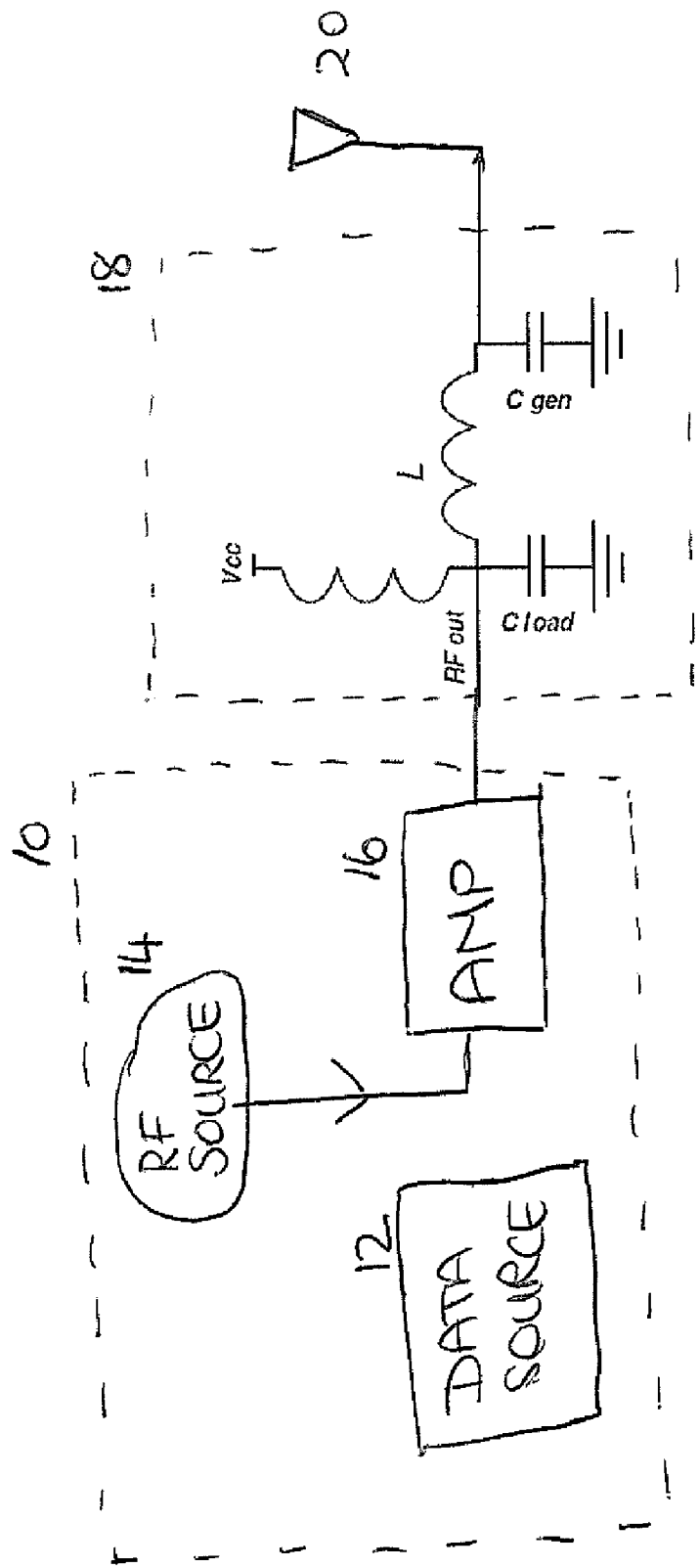
FIG. 1 is a block diagram of a transmitting device with a matching network between the antenna and transmitter.

Referring to FIG. 1, a transmitter 10 comprises a data source 12 whose data modulates an RF signal (from an RF source 14), which is subsequently amplified by an amplifier 16. The signal from the transmitter 10 is forwarded through a matching network 18 to an antenna 20 for transmission to a receiver (not shown).

Remote key or TPMS transmitting devices typically employ high Q antennas (that have a highly reactive impedance due to their small size). Accordingly, all its components must be very accurately tuned. For example, the antenna and transmitter impedance must be well defined. However, antennas are very sensitive to detuning. For example, interaction with nearby objects (e.g. the human body [the so-called 'hand effect'] or a car) can drastically change the impedance of an antenna.

As previously mentioned, for maximum efficiency, the impedance of an antenna ($Z_{LOAD}$) should be matched to the impedance of its transmitter ($Z_{GEN}$). In practise, the matching network 18 achieves this matching. The matching network 18 is in effect a transformer that changes the U/I ratio between the transmitter 10 and the antenna 20. The matching network 18 typically comprises at least two capacitors $C_{LOAD}$ and $C_{GEN}$ and an inductor L. By varying the inductance (L) and capacitances $C_{LOAD}$ and $C_{GEN}$, the matching network 18 may be tuned to the impedance of the antenna 20.

Once tuned, a matching network 18 is optimal for only one impedance. Thus, any changes in the impedance of the antenna 20 will affect the efficiency of the transmitting device. Indeed, in extreme conditions, the loss in efficiency can be as high as 10 dB with a small loop antenna. In such cases, the only way to maintain optimal matching between the impedances of the antenna 20 and transmitter 10 is by manual adjustment of the matching network 18.

Some prior art solutions, automatically adjust the capacitance of the transmitter to minimize the reactance presented to the power amplifier. Another approach is to widen the characteristics of the antenna and matching network by lowering the quality factor of both. In this case, surrounding conditions have less effect on the impedance of the antenna. However, the overall efficiency of the transmitting device is reduced.

Alternatively, the transmitting device may be specifically designed to cope with a wide variety of environmental conditions by increasing the RF power of its transmissions. However, this wastes battery energy, thereby reducing battery life or increasing battery size and cost. This is especially problematic in automotive applications, which are particularly sensitive to cost and energy issues.

The present invention extends on the structure of a conventional matching network, by integrating its capacitors $C_{LOAD}$ and $C_{GEN}$ into a chip that automatically adjusts both of them to maximise the output power of a transmitting device. More particularly, and referring to FIG. 2, the present invention comprises two capacitors $C_{LOAD}$ and $C_{GEN}$ connected to ground, wherein the capacitors are adjustable by means of a plurality of parallel capacitor banks 30, 32 switched by a state machine 34. The capacitors $C_{LOAD}$ and $C_{GEN}$ are typically provided in a PI arrangement. Other arrangements are also possible (e.g. T arrangement, differential arrangement, etc.) but are less convenient to implement.

The state machine 34 is further connected to a voltage sensor 36. The voltage sensor 36 measures the output power of the transmitting device as a voltage on one of the capacitors $C_{LOAD}$ and $C_{GEN}$ (since voltage is related to the square of power at fixed impedance). Accordingly, the present invention measures the voltage directly at the input to the antenna system. This contrasts with the prior art systems that measure power, for example, at the input to the matching network. However, measurements of voltage directly at the input to the antenna provide a more reliable parameter than measurements at the input to the matching network.

Figure 3:
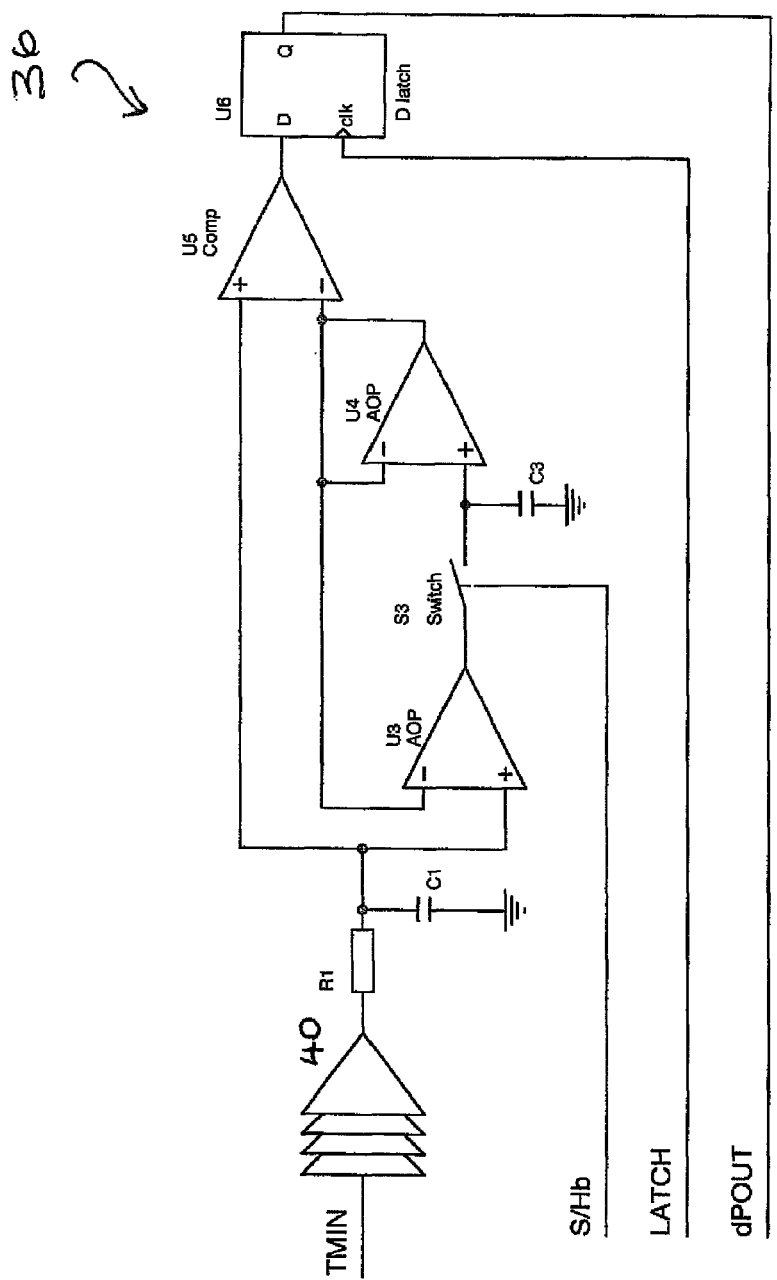
FIG. 3 is a circuit diagram of a voltage sensor in the embodiment of FIG. 2.

The output power measurement provided by the voltage sensor 36 is not an absolute value. However, only relative measurements are needed to detect an increase or decrease in the output power of the transmitting device. Referring to FIG. 3, the voltage sensor 36 comprises a logarithmic detector 40 with a given gain (expressed in mV/dB) which converts an input RF signal to a DC voltage on capacitor C1. This voltage is compared by comparator U5 with a previously sampled voltage in capacitor C3. The output from the comparator U5 will be high (i.e. value='1') if the RF signal and the detected DC voltage on capacitor C1 is greater than a previously stored one. Any change of DC level greater than the offset of comparator U5 is detected. Hence, it may be necessary to have some amplification in the logarithmic detector 40 to achieve the required sensitivity.

Returning to FIG. 2, the state machine 34 implements an algorithm that tunes the capacitors $C_{LOAD}$ and $C_{GEN}$ by optimising the output power of the transmitter. Accordingly, the output power measurement from the voltage sensor 36 is forwarded to the state machine 34, which then decides, in accordance with the algorithm, which of the two capacitors $C_{LOAD}$ and $C_{GEN}$ should be changed to optimize the output power of the transmitting device.

By adjusting the two capacitors $C_{LOAD}$ and $C_{GEN}$ in this fashion, the impedance matching range of the present invention is considerably increased, both in the real and imaginary directions. In particular, the present invention overcomes the limitations of the prior art by acting on both the reactive and resistive parts of the impedances and thereby providing conjugate matching of the antenna to the transmitter. In higher power systems, all three elements of a matching network (i.e. the two capacitors $C_{LOAD}$ and $C_{GEN}$ and the induction coil) are often variable. However, this is not practical in a fully integrated system. Furthermore, the complexity of the optimization algorithm would become excessive, particularly in a "mobile" environment.

By using peak voltage measurements rather than phase measurements, the present invention functions regardless of the nature of the transmitter. Thus, the present invention is operable with high efficiency Class-C transmitters. Further, as the matching network (i.e. of the capacitors $C_{LOAD}$ and $C_{GEN}$) usually has a high Q, the invention also compensates component tolerances in the matching network and drift (thermal, ageing, etc).

The present invention automatically adjusts the matching network between a transmitter and an antenna (or any load) and optimizes power transfer therebetween even if:
- the antenna impedance changes (e.g. in handheld devices);
- and/or the matching network components vary (and the high Q of the matching network makes all such variations critical).

Since the present invention automatically adjusts the matching network in a transmitting device regardless of its surrounding conditions, the power sent to the antenna is always at a maximum. In particular, the improvements in power transfer provided by the present invention can be as high as 10 dB. As a result, the RF power to the antenna in the transmitting device can be reduced, thereby saving battery energy and enabling the size and cost of the battery to be reduced.

The present invention is not restricted to automotive applications and in particular is also applicable to any system employing remote sensors or peripherals (e.g. alarms, weather stations etc.). These systems may use Zigbee, Bluetooth etc.

The optimization algorithm optimizes each capacitor $C_{LOAD}$ and $C_{GEN}$ one after another, in accordance with the impedance ratio. Several optimization paths can be programmed (which may be necessary for high Q matching network).

The optimization of each capacitor $C_{LOAD}$ and $C_{GEN}$ is done by ramping up or down a register that switches the capacitor banks 30, 32. The optimisation algorithm stops when the maximum output power is found or when the register reaches a limit (or a maximum or minimum value is found for one of the capacitors $C_{LOAD}$ and $C_{GEN}$ if the absolute optimum cannot be reached). The optimisation algorithm may employ a hill-climbing approach or any other suitable optimisation approach.

Figure 4:
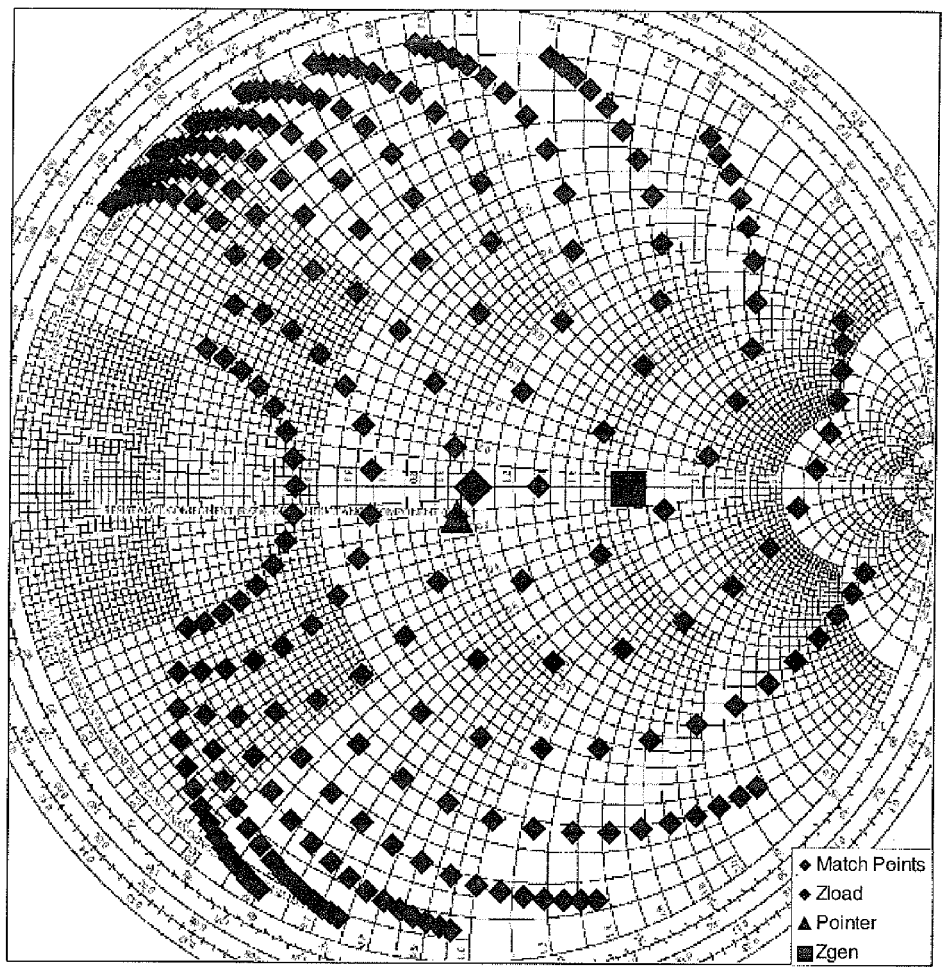
FIG. 4 is a Smith chart showing the operation of the optimisation algorithm employed in the embodiment of FIG. 2.

FIG. 4 shows a variety of impedance matching possibilities for a given transmitting device. The impedance matching possibilities are depicted as black dots and collectively represent the search space within which the optimization algorithm can search to find the optimal matching impedance. The triangle represents the impedance of the transmitter ($Z_{GEN}$) and the cross X represents the impedance of the antenna ($Z_{LOAD}$). In effect, the optimization algorithm finds the black dot closest to the cross (X). In other words, the optimization algorithm finds the matching impedance (shown by a square) that most closely matches the antenna impedance.

Figure 5A:
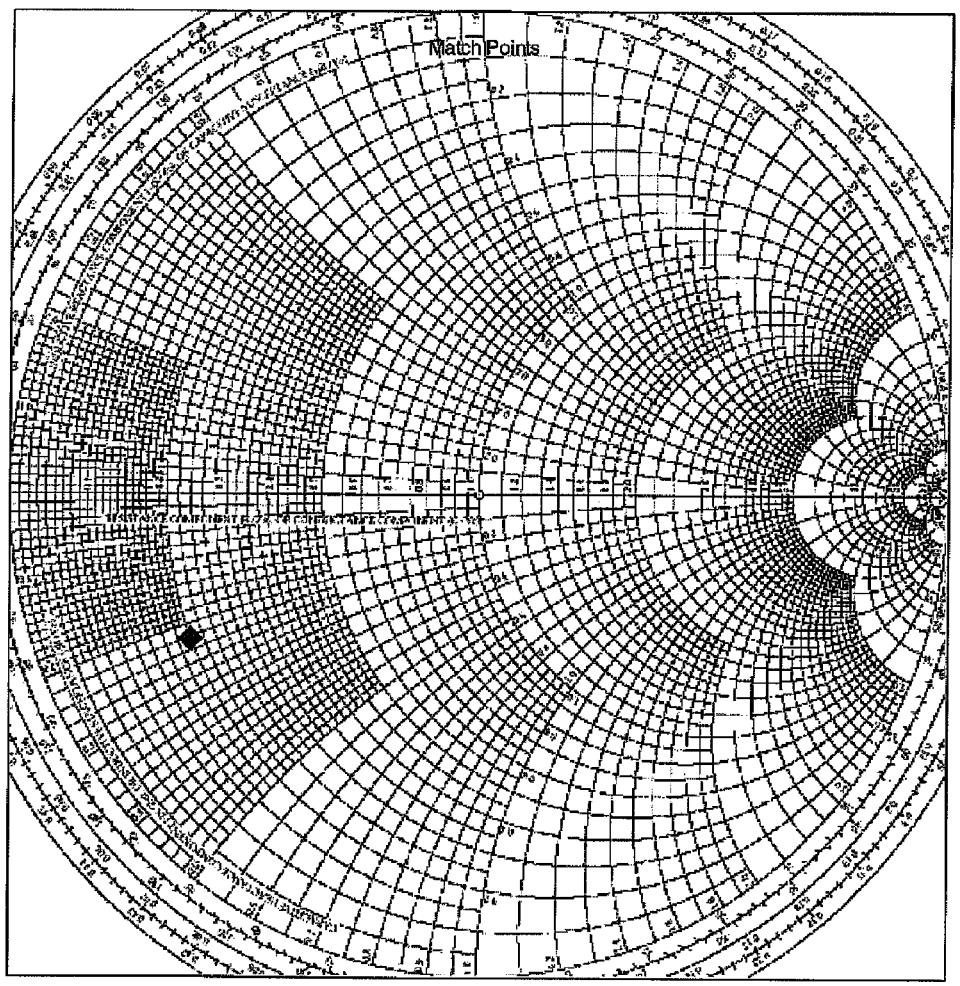
FIG. 5a is a Smith chart of a detuned matching network for a transmitting device operating at 433 MHz.
Figure 5B:
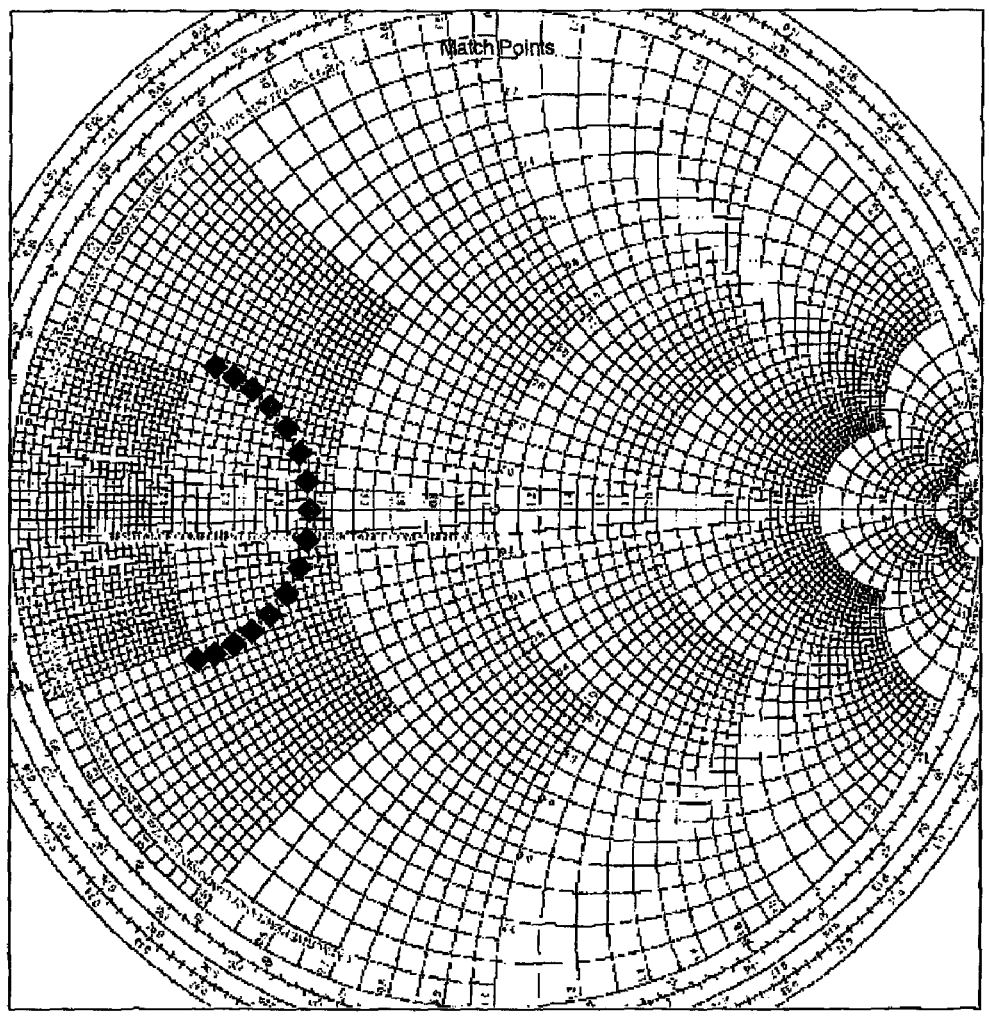
Figure 5C:
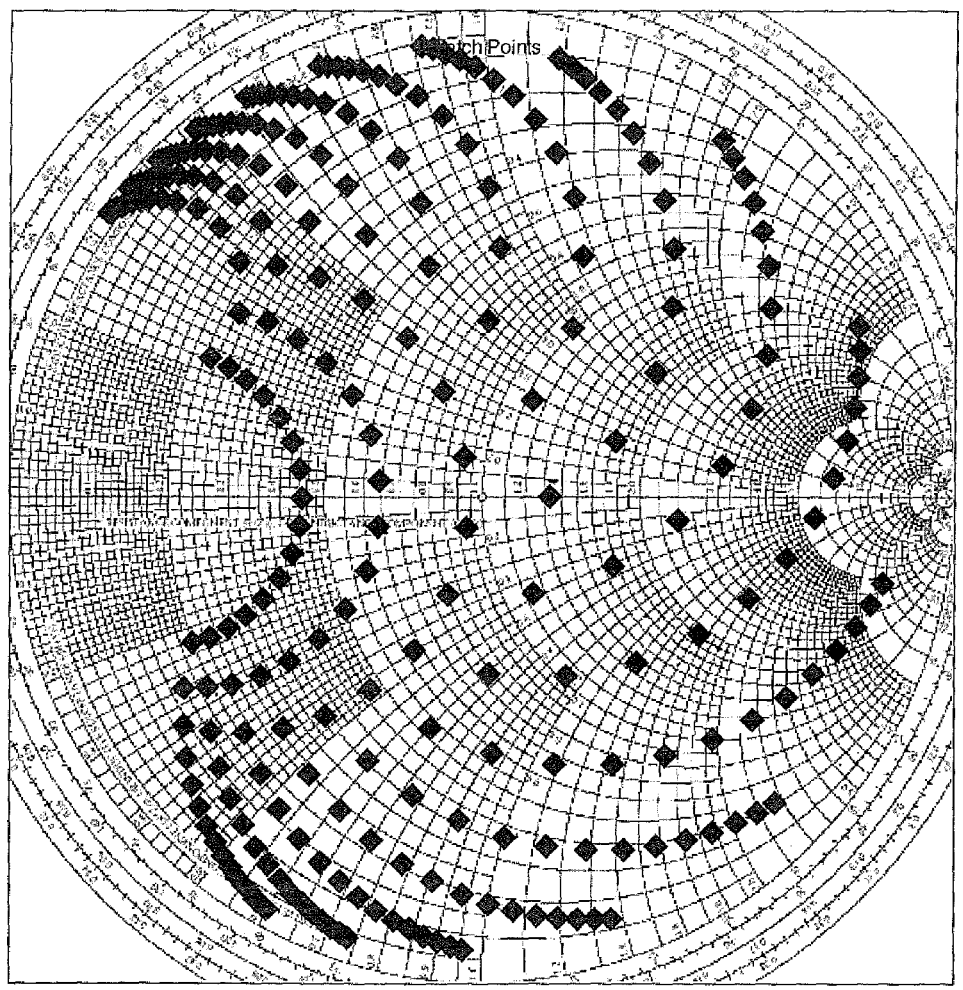
FIG. 5c is a Smith chart showing the different matching points possible with an adjustment of a second capacitor in the matching network controlled by the embodiment of FIG. 2 in the transmitting device of FIG. 5a, following the adjustment of the first capacitor in FIG. 5b.

Referring to FIG. 5*a*, we see an intentional detuning of a matching network at 433 MHz, so that the output impedance of the network is no longer 50Ω. Referring to FIG. 5*b*, by changing the capacitance of capacitor $C_{LOAD}$ in 16 steps of 3 pF, various matching points are joined. Referring to FIG. 5*c*, by additionally changing the capacitance of capacitor $C_{GEN}$ in 16 steps of 0.5 pF, a network of matching points is drawn. The present invention is able to match all those points perfectly and the surrounding location with minimum mismatch.

Performance Test

Let an antenna have an impedance of 4+j100Ω in a free field. A conventional matching network is designed to match a 50Ω transmitter to the antenna impedance of 4+j100Ω. Let the antenna's impedance when modified by the hand-effect be 10+j70Ω. The loss in output power of the transmitting device arising from the mismatch of the transmitter impedance with the modified antenna impedance is calculated. Similar calculations are performed for a matching network controlled by the present invention.

Figure 6A:
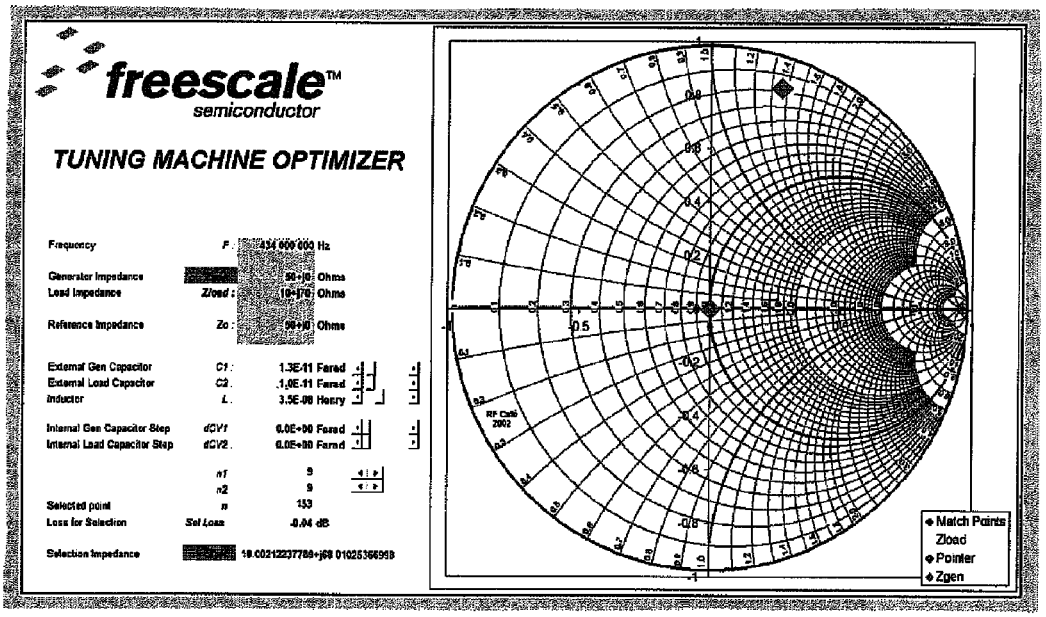
FIG. 6a is a Smith chart showing the operation of a conventional matching network in a transmitting device under free field conditions.
Figure 6B:
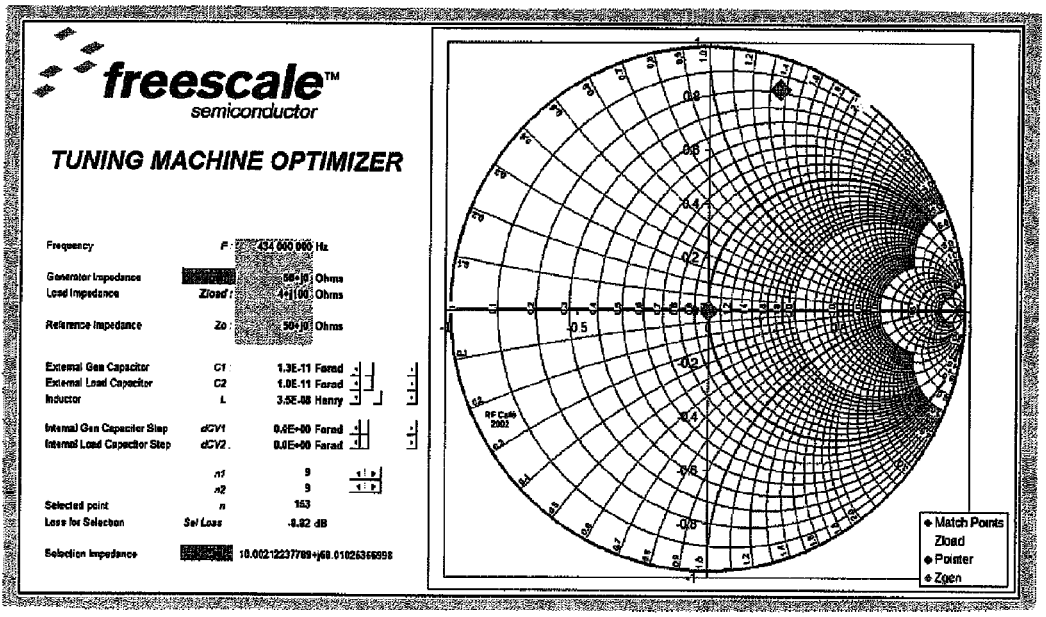
FIG. 6b is a Smith chart showing the operation of the conventional matching network of FIG. 6a, wherein the impedance of the antenna has been altered by the hand-effect.

Referring to FIG. 6*a*, under free field conditions, the conventional matching network achieves close matching with the antenna impedance; and the loss in the output power of the transmitting device is −0.04 dB. However, referring to FIG. 6*b*, when the antenna impedance is altered by the hand-effect, the conventional matching network is no longer capable of matching the antenna impedance; and the loss in the output power of the transmitting device is −8.82 dB.

Figure 6C:
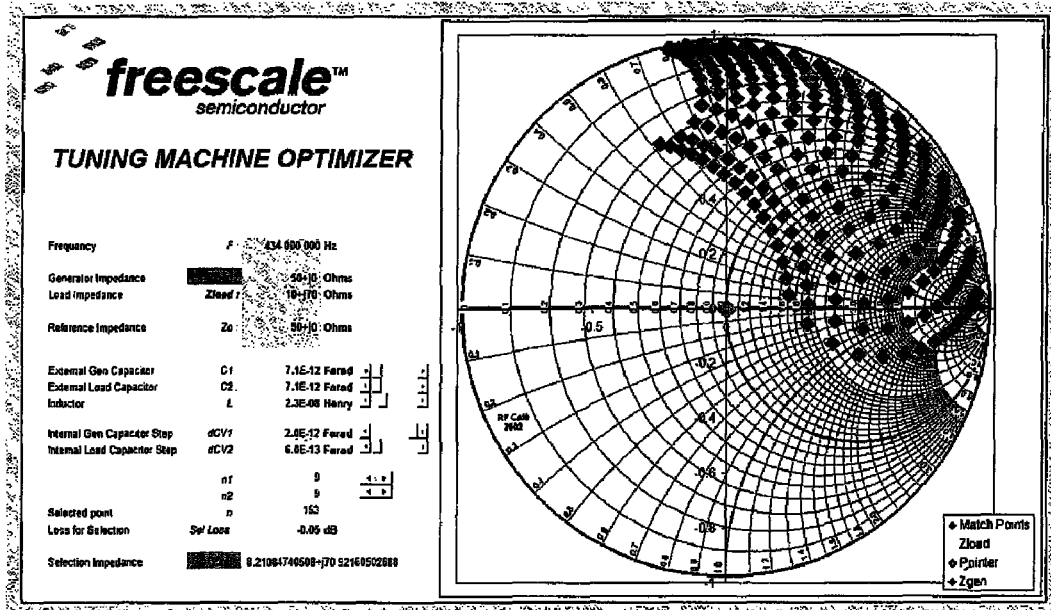
FIG. 6c is a Smith chart showing the operation of a matching network controlled by the embodiment of FIG. 2 in a transmitting device under free field conditions.
Figure 6D:
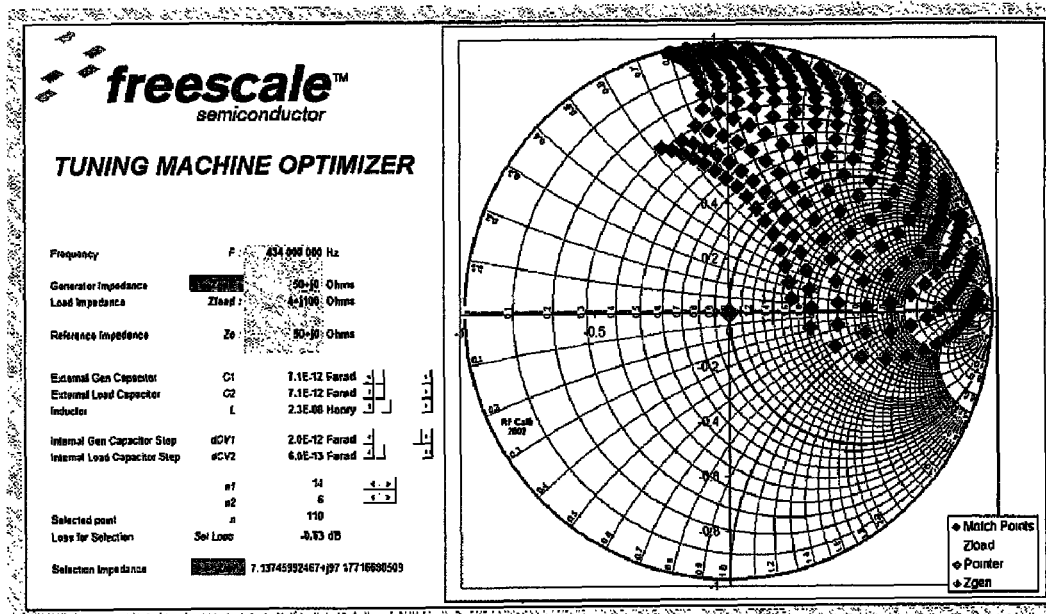
FIG. 6d is a Smith chart showing the operation of a matching network controlled by the embodiment of FIG. 2 in FIG. 6c, wherein the impedance of the antenna has been altered by the hand-effect.

Referring to FIG. 6*c*, under free field conditions, the matching network controlled by the present invention also achieves close matching with the antenna impedance; and the loss in the output power of the transmitting device is −0.05 dB. However, referring to FIG. 6*d*, when the antenna impedance is altered by the hand-effect, the matching network controlled by the present invention, in contrast with the conventional matching network (of FIG. 5*b*), is still capable of achieving close matching with the antenna impedance; and the loss in the output power of the transmitting device is −0.63 dB.

A similar study was performed of the network controlled by the present invention wherein only the $C_{GEN}$ capacitance was changed (i.e. to provide only reactive impedance cancellation in a similar fashion to a number of the afore-mentioned prior art systems). Table 1 compares the performance of a conventional matching network, the reactive cancellation only network and the matching network controlled by the present invention (in which both capacitors are adjusted). Referring to Table 1, it can be seen that the present invention has superior performance compared to the conventional matching network and reactive part cancellation approach. In particular, the present invention has a power loss of approximately 5 dB less than the reactive cancellation approach and 8 dB better than the conventional matching network in the present example.

Alterations and modifications may be made to the above without departing from the scope of the invention.

TABLE 1

Variability of Power Loss in a Transmitting Device Under Different Operating Conditions with Different Impedance Matching Networks

| Type of Impedance Matching Network | Power Loss under Free Field $Z_{out} = 10 + j70$ | Power Loss with Hand Effect to Antenna $Z_{out} = 4 + j100$ | Variability |
|---|---|---|---|
| Present Invention | 0.05 dB | 0.63 dB | 0.58 dB |
| Reactive Impedance Matching Only | 0.05 dB | 5.81 dB | 5.76 dB |
| Conventional Matching Network | 0.04 dB | 8.82 dB | 8.78 dB |

The invention claimed is:

1. A transmitting device comprising:
   a transmitter;
   an antenna;
   a voltage sensor coupled to an input of the antenna, the voltage sensor comprising:
      a comparator having a first input, a second input, and an output, wherein the first input is coupled to an input of the antenna; and
      a capacitor coupled to the second input of the comparator, wherein the capacitor is to store a sampled antenna input voltage; and
   a matching network coupled to an output of the transmitter and to the input of the antenna, the matching network comprising a plurality of capacitors, wherein the plurality of capacitors are adjusted to tune the matching network to the impedance of the antenna based upon an output of the comparator.

2. The transmitting device as claimed in claim 1, wherein the transmitting device further comprises a state machine, configured to:
   receive the output of the comparator; and
   use the output of the comparator to control the adjustment of the plurality of capacitors.

3. The transmitting device as claimed in claim 2, wherein:
   the plurality of capacitors comprise a plurality of capacitor banks; and
   the adjustment of the plurality of capacitors comprises selectively switching one capacitor bank of the plurality of capacitor banks by the state machine.

4. The transmitting device as claimed in claim 3 wherein the state machine includes a register that switches the one capacitor bank.

5. The transmitting device as claimed in claim 1 wherein the plurality of capacitors are adjusted based upon a hill-climbing optimisation algorithm.

6. The transmitting device as claimed in claim 1, wherein the plurality of capacitors are provided in a PI arrangement.

7. The transmitting device as claimed in claim 1, wherein the output of the comparator provides a relative measurement of a voltage at the input of the antenna.

8. The transmitting device as claimed in claim 7, wherein, in providing the relative measurement, the output of the comparator provides:
   a first output value when the voltage at the input of the antenna is higher than a voltage on the capacitor; and
   a second output value when the voltage at the input of the antenna is lower than the voltage on the capacitor.

9. A method of tuning a transmitting device comprising a transmitter and an antenna, the method comprising:
   providing a matching network between the transmitter and the antenna; the matching network comprising a plurality of capacitors;
   determining a voltage value at an input to the antenna;
   comparing the voltage value with a stored antenna input voltage to determine a relative voltage value, the stored voltage being stored at a stored capacitor; and
   adjusting one capacitor of the plurality of capacitors to tune the matching network to the impedance of the antenna based upon the relative voltage value at the input to the antenna.

10. The method of claim 9, the transmitting device further comprising a state machine, and the method further comprising:
    receiving the relative voltage value by the state machine;
    wherein adjusting the one capacitor is performed by the state machine, and is in response to receiving the relative voltage value by the state machine.

11. The method of claim 10, wherein:
    the plurality of capacitors comprise a plurality of capacitor banks; and
    adjusting the one capacitor further comprises selectively switching one capacitor bank of the plurality of capacitor banks by the state machine.

12. The method of claim 10 wherein, in adjusting the one capacitor, the method further comprises:
    operating an optimisation algorithm by the state machine to determine which capacitor of the plurality of capacitors is the one capacitor that is adjusted.

13. The method of claim 12, wherein the optimisation algorithm comprises a hill-climbing optimisation algorithm.

14. A transmitting device comprising:
    an antenna;
    a voltage sensor coupled to an input of the antenna, the voltage sensor comprising:
      a logarithmic detector that samples a radio frequency signal from an input of the antenna and converts the sampled radio frequency signal to a DC voltage;
      a first capacitor configured to store a first DC voltage from a current sample of the radio frequency signal:
      a second capacitor configured to store a previous sample of the radio frequency signal:
      a comparator having a first input coupled to the first capacitor, and a second input coupled to the second capacitor, and an output; and
      an input of the antenna; and
    a matching network coupled to a transmitter and to the input of the antenna, the matching network comprising a plurality of capacitors, wherein the plurality of capacitors are adjusted to tune the matching network to the impedance of the antenna based upon the output of the comparator.

15. The transmitting device of claim 14, further comprising:
    a state machine coupled to the output of the comparator, wherein the matching network operates to adjust the plurality of capacitors based upon the output of the comparator.

16. The transmitting device of claim 15, wherein:
    the plurality of capacitors comprise a plurality of capacitor banks; and
    the adjustment of the plurality of capacitors comprises selectively switching one capacitor bank of the plurality of capacitor banks by the state machine.

17. The transmitting device of claim 16, wherein the state machine includes a register that switches the one capacitor bank.

18. The transmitting device of claim 14; wherein the plurality of capacitors are adjusted based upon a hill-climbing optimisation algorithm.

19. The transmitting device of claim 14, wherein the plurality of capacitors are provided in a PI arrangement.

\* \* \* \* \*